(12) United States Patent
Shen et al.

(10) Patent No.: US 10,636,848 B2
(45) Date of Patent: Apr. 28, 2020

(54) ORGANIC LIGHT EMITTING DISPLAY PANEL AND FORCE-SENSING DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Yongcai Shen, Shanghai (CN); Dong Qian, Shanghai (CN); Yu Xin, Shanghai (CN); Wang Li, Shanghai (CN); Qingjie Fan, Shanghai (CN)

(73) Assignees: SHANGHAI TIANMA AM-OLED CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 36 days.

(21) Appl. No.: 15/487,915

(22) Filed: Apr. 14, 2017

(65) Prior Publication Data

US 2017/0221971 A1 Aug. 3, 2017

(30) Foreign Application Priority Data

Dec. 13, 2016 (CN) .......................... 2016 1 1147551

(51) Int. Cl.
| | |
|---|---|
| *G06F 3/041* | (2006.01) |
| *H01L 27/32* | (2006.01) |
| *H01L 51/52* | (2006.01) |
| *G06F 3/044* | (2006.01) |

(52) U.S. Cl.
CPC ............ *H01L 27/323* (2013.01); *G06F 3/044* (2013.01); *G06F 3/0412* (2013.01); *H01L 27/3276* (2013.01); *H01L 51/5206* (2013.01); *H01L 51/5221* (2013.01); *G06F 2203/04105* (2013.01)

(58) Field of Classification Search
CPC ............... H01L 27/323; H01L 27/3276; H01L 51/5206; H01L 51/5221; G06F 3/044; G06F 3/0412; G06F 2203/04105
See application file for complete search history.

(56) References Cited

U.S. PATENT DOCUMENTS

| | | | | |
|---|---|---|---|---|
| 2016/0283005 A1* | 9/2016 | Lee | ....................... | G06F 3/0412 |
| 2017/0131818 A1* | 5/2017 | Chang | .................... | G06F 3/0414 |
| 2018/0095581 A1* | 4/2018 | Hwang | .................. | H01L 27/323 |

FOREIGN PATENT DOCUMENTS

| | | |
|---|---|---|
| CN | 102834795 A | 12/2012 |
| CN | 106055155 A | 10/2016 |
| CN | 106206666 A | 12/2016 |

* cited by examiner

*Primary Examiner* — Towfiq Elahi
(74) *Attorney, Agent, or Firm* — Anova Law Group PLLC (57) ABSTRACT

An organic light emitting display panel is provided. The organic light emitting display panel includes a first substrate; a second substrate disposed to the first substrate; and a force sensing layer. The force sensing layer includes a first electrode; a second electrode; and a first insulating layer positioned between the first electrode and the second electrode. The second electrode is multiplexed with at least one second conductive layer on the second substrate.

20 Claims, 5 Drawing Sheets

ORGANIC LIGHT EMITTING DISPLAY PANEL AND FORCE-SENSING DISPLAY DEVICE

CROSS-REFERENCES TO RELATED APPLICATIONS

This application claims priority of Chinese Patent Application No. 201611147551.6, filed on Dec. 13, 2016, the entire contents of which are hereby incorporated by reference.

FIELD OF THE DISCLOSURE

The present disclosure generally relates to the field of display technology and, more particularly, relates to an organic light emitting display panel and force-sensing display device.

BACKGROUND

An Organic Light Emitting Diode (OLED) display panel, also known as organic electroluminescent display (OELD), is a kind of thin film light emitting device made of organic semiconductor materials and driven by a DC voltage. The OLED display-technology is different from traditional LCD display technology, as it does not need backlight and uses a very thin organic material coating and glass-substrate and, when there is a current passing through, the organic material can emit light. Thus, OLED display screens can be made lighter and thinner, offering greater viewing angles and significant energy saving.

Further, when the touch and force sensing function is integrated in the OLED display panels, better user interfaces can be provided for the OLED display panels, which shows good application prospects.

For the OLED display panels currently on the market, the force sensing is achieved by adding a force sensor module at the back of the display module, using either capacitive or resistive force sensing technology.

Under a touch force, the resistive force sensor can calculate the size of the force based on the change of the output voltage caused by contain between two resistance layers, or the capacitive force sensor can calculate the size of the force based on the change of the capacitance caused by change in the distance between upper and lower electrodes.

However, according to the present disclosure, in the existing force sensing technology, the force sensing module and display module are arranged separately, and often need a separate IC to drive the respective module, raising product cost.

The disclosed OLED display panel and force sensing device are directed to solving at least partial problems set forth above and other problems. It should be noted that, the information disclosed in the aforementioned background section is only used to enhance understanding of the background of the present disclosure, and may thus include existing information readily known to those ordinarily skilled in the art.

BRIEF SUMMARY OF THE DISCLOSURE

One aspect of the present disclosure includes an organic light emitting display panel. The organic light emitting display panel includes a first substrate; a second substrate disposed to the first substrate; and a force sensing layer. The force sensing layer includes a first electrode; a second electrode; and a first insulating layer positioned between the first electrode and the second electrode. The second electrode is multiplexed with at least one second conductive layer on the second substrate.

Another aspect of the present disclosure includes a force sensing display device. The force sensing display device includes an organic light emitting display panel. The organic light emitting display panel includes a first substrate; a second substrate disposed opposite to the first substrate; and a force sensing layer. The force sensing layer includes a first electrode; a second electrode; and a first insulating layer positioned between the first electrode and the second electrode. The second electrode is multiplexed with at least one second conductive layer on the second substrate.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into and constitute a part of this specification, illustrate one or more embodiments of the present disclosure and, together with the detailed description, serve to explain the principles and implementations of the disclosure. Apparently, the drawings described below only correspond to some embodiments of the present disclosure, and it is possible for those ordinarily skilled in the art to derive other drawings from the accompanying drawings without creative effort.

DETAILED DESCRIPTION

Exemplary embodiments will be described in detail hereinafter with reference to accompanying drawings. However, embodiments of the present disclosure may be implemented in many different forms and should not be construed as being limited to the embodiments set forth herein. Rather, these embodiments are provided so that the present disclosure can be understood by those skilled in the art. The described features, structures, or characteristics may be combined in any suitable manner in one or more embodiments. In the following description, numerous specific details are given to provide understanding of embodiments of the present disclosure. Those skilled in the relevant art will recognize, however, that technical solutions of the present disclosure can be practiced without one or more of the specific details, or with other methods, components, devices, or steps, etc.

In addition, the accompanying drawings of the present disclosure are only schematic, like reference numerals in the drawings denote same or like elements, and thus repetitive description thereof may be omitted. Further, in addition to illustrating hardware components, certain block diagrams illustrated in accompanying drawings may be functional entities, and may not necessarily correspond to physically or logically independent entities. These functional entities may be implemented by means of software, or one or more hardware modules or an integrated circuit. Or, these functional emitter may be implemented hi different networks and/or processor devices and/or microcontroller devices.

One of the main components of a display device is a display panel containing a pixel matrix. An organic light emitting display panel is made of a thin organic material layer and a glass substrate. The organic material can emit light when a current is passing through. The color of the light emitted by the OLED panel depends on the material of the organic light-emitting functional layer. Thus, a desired color can be obtained by changing the material of the organic light-emitting functional layer. The present disclosure provides an organic light emitting display panel that integrates a force sensing function with a display panel, thereby reducing production cost and process difficulty.

Figure 1:
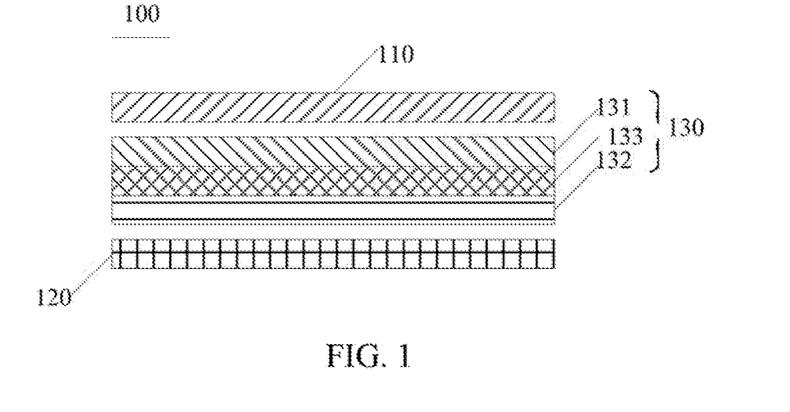
FIG. 1 illustrates a structural diagram of an exemplary organic light emitting display panel consistent with the disclosed embodiments.

FIG. 1 illustrates an exemplary organic light emitting display panel according to embodiments of the present disclosure. As shown in FIG. 1, an organic light emitting display panel 100 includes a first substrate 110, a second substrate 120, and a force-sensing layer 130. Other components may also be included.

The first substrate 110 and the second substrate 120 are disposed facing each other. The force-sensing layer 130 includes a first electrode 131, a second electrode 132, and a first insulation layer 133 positioned between the first electrode 131 and the second electrode 132, and the first electrode 131 and the second electrode 132 are disposed feeing each other.

When the organic light emitting display panel 100 is touched with force (e.g., being pressed by a pen or a user's finger), the portion of the first substrate 110 that is pressed and its vicinity is slightly bent, and the first electrode 131 becomes closer to the second electrode 132. Thus, the distance between the first electrode 131 and the second electrode 132 becomes smaller and, at the same time, the first insulation layer 133 between the first substrate 110 and the second substrate 120 is pressed so that the capacitance between upper and lower layers of the first electrode 131 and the second electrode 132 becomes larger than the capacitance when not being pressed.

At this time, by detecting the amount of current outputted to the signal line connected to the force-sensing layer 130, the capacitance between the first electrode 131 and the second electrode 132 can be detected, so that the magnitude of the applied force can be accurately calculated. By including the force-sensing layer capable of correctly, outputting a capacitance change in the organic light emitting display panel, when the first substrate 110 is pressed, the magnitude of the force applied on the first substrate 110 can be accurately calculated.

It should be noted that, although the first electrode 131 is provided on the side of the first substrate 110 facing the second substrate 120, as shown in FIG. 1, other arrangements can also be used. For example, in another embodiment, the first electrode 131 may be disposed on the other side of the first substrate 110 away from the second substrate 120.

Similarly, although the second electrode 132 as illustrated in FIG. 1 is disposed on the second substrate 120, the second electrode 132 may be multiplexed with at least one second conductive layer on the second substrate 120.

Figure 2:
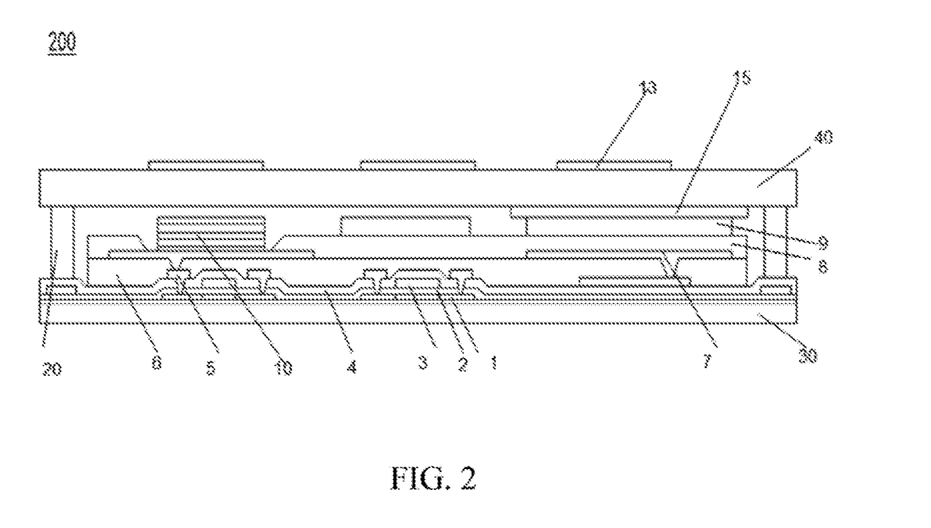
FIG. 2 illustrates a structural diagram of another exemplary organic light emitting display panel consistent with the disclosed embodiments.

FIG. 2 illustrates another exemplary organic light emitting display panel. As shown in FIG. 2, an organic light emitting display panel 200 may include a first substrate or a cover substrate 40 (e.g., cover glass) and a second substrate or an array substrate (e.g., TFT glass). Other components may also be included.

The array substrate may be a bottom gate type or a top gate type, and the present disclosure is not limited thereto. For illustrative purposes, the bottom gate type is used as an example.

The array substrate may include a base substrate 30, a polycrystalline silicon (Poly-Si) or polysilicon layer 1 provided on the upper surface of the base substrate 30, a gate insulation layer 2 provided on the tipper surface of the polysilicon 1, a gate metal layer 3 of the non-light-emitting region of the pixels, a second insulation layer 4, a second metal layer 5 provided on the light-emitting region of the pixels, a planarization layer 6, a reflective electrode layer 7 provided on the upper surface of the planarization layer 6, a pixel definition layer 8 provided on the upper surface of the reflective electrode layer 7, a plurality of optical spacers 9 provided on the upper surface of the pixel definition layer 8, and an OLED light emitting unit 10 disposed above the second metal layer 5. Certain components/structures may be omitted and other structures and components may be added.

In one embodiment, the polysilicon layer 1 may be made of a low temperature polysilicon (LTPS). A low-temperature polysilicon-thin-film-transistor organic light-emitting display panel, during the packaging process, uses excimer laser as a heat source. The laser light passes through the projection system to produce a laser beam with evenly distributed energy, which is then projected on the amorphous silicon structure of the glass substrate. After absorbing the energy of the excimer laser, the amorphous silicon structure of the glass substrate is transformed into a polysilicon structure. Because the entire process is completed at a temperature below 600° C., any ordinary glass substrate can be used.

In another embodiment, the polysilicon layer 1 may also be made of a high temperature polysilicon (HTPS). Further, the TFT type used in the OLED array substrate may also be an oxide TFT, an organic field effect transistor, or a-Si TFT, etc.

The planarization layer 6 may be used to improve the unevenness of the surface of the substrate. The pixel definition layer 8 can significantly reduce the reflection of the array substrate to ambient light.

Further, the packaging substrate 40 and the array substrate form a box-like structure for encapsulating the OLED light-emitting unit 10 through a metal frit 20 as sealing material or a glass frit, so as to prevent damage to the OLED light-emitting unit 10 due to air or moisture. Certainly, the sealing material is not limited to the metal frit 20, and may be any suitable organic sealant, inorganic sealant or a mixture of organic and inorganic sealants.

Although not shown, the array substrate may also include gate electrode lines, data lines, and power lines, intersecting with one another, and thin film transistors arranged in an array. The thin film transistors are also arranged in regions defined by the intersected gate electrode lines, data lines, and power lines. The power lines are used to provide a bias voltage. Under the voltage applied to the power lines and a voltage applied to the OLED cathode layer of the OLED light emitting wait 10, the OLED light emitting unit 10 is in a reverse bias state and the light intensity of the OLED light emitting unit 10 can be controlled.

The pixel definition layer 8 is provided in the non-light emitting area of each pixel, the OLED light emitting unit 10 is provided in the light emitting area of each pixel, and each OLED light emitting unit 10 is surrounded by the pixel definition layer 8. That is, each pixel definition layer 8 defines each OLED emits light unit 10.

Although only one OLED light emitting unit 10 is shown in FIG. 2, the organic light emitting display panel 200 may include a plurality of OLED light emitting units 10 arranged m an array, such as an OLED light emitting unit R, an OLED light emitting unit G, and an OLED light emitting unit B respectively corresponding to three OLED light emitting units displaying red, green and blue colors. In other embodiments of the present disclosure, OLED light emitting units of other colors, such as white or yellow, may also be used.

Although not shown, each OLED light emitting unit 10 may be formed by stacking different layers from bottom to top, such as an OLED anode layer, an organic light emitting functional layer, and an OLED cathode layer. The organic light emitting functional layer may include a hole injection layer, a hole transfer layer, a light emitting layer, and an electron transfer layer. The OLED cathode layer may be made of a transparent conductive material(s), such as one or more of ITO, IZO, ZnO, and In2O3. The OLED anode layer may be made of a metal material(s), such as one or more of Ag, Mg, Al, Pt, Au, Ni, Nd, Ir, and Cr. It should be noted that, in certain other embodiments, the positions of the OLED cathode layer and the OLED anode layer can be interchanged, and the materials of the two layers can also be interchanged accordingly.

In certain embodiments shown in FIG. 2, the second electrode 132 (shown in FIG. 1) may at least partially multiplexed with the reflective electrode layer 7 on the array substrate, where the partially multiplexed reflective electrode layer 7 may be used as the second conductive layer on the second substrate 120. For example, the reflective electrode layer 7 not located in the OLED light emitting unit 10, i.e., the portion of the reflective electrode layer of the non-light emitting region, may be used as the second electrode 132 of the force-sensing layer 130.

In such multiplexing manner, the manufacturing process of the second electrode can be reduced, the cost can also be reduced and, at the same time, the thickness of the finally-formed organic light emitting display panel can be reduced. In other embodiments, however, the second electrode 132 may be provided in a non-multiplexing manner, such as adding a conductive layer on the array substrate, where the additional conductive layer acts as the second conductive layer on the second substrate, and the addition conductive layer may be used as the second electrode 132 of the force sensing layer.

Further, the organic light emitting display panel 200 may include a touch sensor for realizing a touch function. The touch sensor may be, for example, a touch conductive glass coated with an ITO conductive layer (ITO Glass), or a touch conductive film (ITO Film). In the following embodiments, the touch sensor is described as ITO Glass, as an example, which may be used in projection capacitive touch panels. Other materials and structures may also be used.

The touch sensor may be provided on the upper surface of the packaging substrate 40 (i.e., an On-Cell touch structure) or provided on the lower surface of the packaging substrate 40 (i.e., an In-Cell touch structure). The touch sensor contains at least one touch layer, and the type of the touch sensor can be a self-capacitive touch sensor, or a mutual-capacitive touch sensor.

In the embodiments shown in FIG. 2, the touch sensor may include a touch layer 13 provided on the upper surface of the packaging substrate 40, i.e., the touch sensor is provided on the side of the packaging substrate 40 away from the array substrate 30. Specifically, a film layer may be formed on the upper surface of the packaging substrate 40 to formed into the touch sensor, i.e., an On-Cell structure is used. The touch layer 13 may be made of ITO (indium tin oxide) material or any other transparent or non-transparent conductive material. Because the On-Cell structure requires only a simple transparent electrode pattern to be formed on the packaging substrate, it is easy to ensure the yield.

It should be noted that the touch sensor may contain only one touch layer, or may contain two or more touch layers. That is, the type of touch sensor can be a self-capacitive touch sensor, or can be a mutual-capacitive touch sensor. In certain other embodiments, two or more touch layers may be used for implementing the touch function. One of the touch layers may be used as a drive electrode layer and the other touch layer may be used as a sensing electrode layer, and a touch insulation layer may be disposed between the drive electrode layer and the sensing electrode layer.

When the touch layer is made of a non-transparent conductive material, in the light transmission direction, the touch layer 13 is positioned on the pixel definition layer 8 (as shown in FIG. 2). When the touch layer is made of a transparent conductive material, the touch layer may be simultaneously positioned on the pixel definition layer 8 and the OLED light emitting unit 10. Alternatively, the portion of the touch layer located on the OLED light emitting unit 10 is made of a transparent conductive material while the portion of the touch layer not located on the OLED light emitting unit 10 may be made of a transparent conductive material or a non-transparent conductive material.

In certain embodiments (as shown in FIG. 1), the first electrode 131 may be any first conductive layer provided on the first substrate 110, that is, the film layer formed on the per surface or the lower surface of the packaging substrate 40 to form a force sensor (i.e., a pressure sensor).

In certain embodiments (shown in FIG. 2), the first electrode 131 (shown in FIG. 1) may be provided on the lower surface of the packaging substrate 40 using, for example, the ITO (indium tin oxide) layer 15 shown in FIG. 2, in which the ITO Layer 15 is used as a first conductive layer, and the ITO layer 15 may be provided on one side of the packaging substrate 40 near to or facing the array substrate 30. Further, the ITO layer 15 may be formed by a high-density arc plasma deposition method or a low voltage sputtering method.

In addition to ITO layer 15, the first conductive layer may also be made of other appropriate material, including any conductive material having a high transmittance, or other conductive material, such as metal, grapheme, or silver nanowire, etc.

In embodiments shown in FIG. 2, the ITO layer 15 used as the first electrode 131 of the force-sensing layer 130 and the reflective electrode layer 7 used as the second electrode 132 of the force-sensing layer 130 are at least partially overlapped. That is, there is a relatively overlapped area between the two layers, which may be used to form the two conductors of the capacitor between the two layers.

Further, the first insulation layer 133 of the force-sensing layer 130 may be at least partially multiplexed with the pixel definition layer 8 and/or the optical spacers 9 between the ITO layer 15 and the reflective electrode layer 7 of the array substrate 30. The pixel definition layer 8 may be made of a black matrix material or the like. The pixel definition layer 8 may also be fabricated into a multi-layer structure, and at least, one or more of the at least two layers may be a light-blocking material Because the pixel definition layer 8 has insulating and non-transparent attributes, it may be used as a first insulation layer 133 (or a portion thereof) of the force sensor 130. The optical spacers 9 may be made of an organic insulating material.

Accordingly, a force touch sensor structure is formed by a conductive layer for forming the force-sensing layer on the lower surface of the packaging substrate 40 and a reflective electrode layer of the array substrate 30 and the pixel definition layer 8 and/or the optical spacers 9. When under a touch force, the force touch sensor structure can detect the capacitance change, and sense the magnitude of the force. At the same time, by multiplexing the pixel definition layer 8 and/or the optical spacers 9 as the first insulation layer of the force-sensing layer, it is possible to further reduce the production cost, simplify the production process, improve the production efficiency, and reduce the thickness of the finally-formed organic light emission display panel, making the display panel lighter and thinner.

In certain embodiments, the first electrode of the force-sensing layer is multiplexed with at least one of the touch layers on the first substrate or multiplexed with the OLED cathode layer on the second substrate. At the same time, the first insulation layer is multiplexed with the pixel definition layer and/or the optical spacers on the array substrate to further reduce the thickness of the display and force sensing module, making the display panel lighter and thinner, simplifying the production process, reducing the production cost, and improving the production efficiency.

In certain other embodiments, it is also possible not to use the multiplexing method and, in such case, a first insulation layer is disposed at a position where the first electrode and the second electrode overlap.

It should be noted that although the optical spacers 9 and the pixel definition layer 8 as the first insulation layer 133 of the force-sensing layer 130, as shown in FIG. 2, are disposed at the entire upper surface of the reflective electrode layer 7 as the second electrode 132 and, in this case, the first insulation layer is capable of better insulating the first electrode and the second electrode, other configurations may also be used. For example, in one embodiment, the first insulation layer may only be located between the portions where the first electrode and the second electrode overlap with each other, as long as the first electrode and the second electrode are insulated.

In certain embodiments, the first insulation layer may be made of SiO2 or other suitable insulating material. The first insulation layer may be formed by a vacuum deposition method or a chemical vapor deposition method.

In certain other embodiments, the second electrode 132 of the force-sensing layer 130 of the organic light emitting display panel may be at least partially multiplexed with the array metal layer of the array substrate. The array metal layer may be any metal layer in the array substrate, such as a gate metal layer 3, a source-drain metal layer, or the like. Further, the second electrode 132 may be multiplexed with the power supply lines, reference voltage lines, and/or a capacitor electrode layer of the array substrate. Accordingly, the ITO layer 15 used as the first electrode 131 disposed on the lower surface of the packaging substrate 40 overlaps with at least part of the area of the array metal layer used as the second electrode 132.

That is, a force touch sensor structure is formed by the first conductive layer for forming the force-sensing layer on the lower surface of the packaging substrate 40 and the array metal layer of the array substrate and the pixel definition layer 8 and/or the optical spacers 9. When under a touch force, the force touch sensor structure can detect the capacitance change, and sense the magnitude of the force. Similarly, by multiplexing the array metal layer on the array substrate as the second electrode of the force-sensing layer, at least one stage of the production process can be reduced, lowering the production cost, improving the production efficiency, and reducing the thickness of the finally-formed organic light emission display panel.

In certain embodiments as shown in FIG. 2, the reflective electrode layer or the array metal layer of the array substrate is multiplexed with the second electrode as examples. In certain other embodiments, the second electrode of the force-sensing layer may be simultaneously multiplexed with the reflective electrode layer and the array metal layer of the array substrate, and the first electrode (e.g., the ITO layer 15) is simultaneously overlapped with at least part of the area of the reflective electrode layer and the array metal layer used as the second electrode. In this way, the area between the upper and lower electrodes of the force-sensing layer can be further increased, and the mutual capacitance for force sensing can be increased, and the sensitivity of the force detection can be improved.

Figure 3:
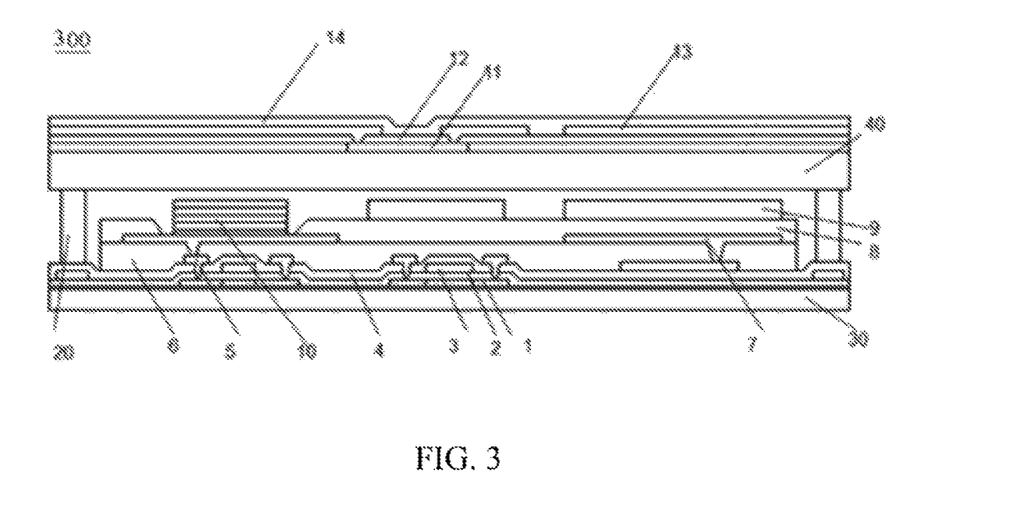
FIG. 3 illustrates a structural diagram of another exemplary organic light emitting display panel consistent with the disclosed embodiments.

FIG. 3 illustrates another exemplary organic light emitting display panel 300. As shown in FIG. 3, the organic light emitting display panel 300 may include a touch panel (TP) metal layer 11 provided on the upper surface of the packaging substrate 40, a touch panel (TP) insulation layer 12 provided on the upper surface of the touch metal layer 11, and one or more touch layers 13 provided on the upper surface of the touch panel insulation layer 12. A touch functional film layer may be integrated over the packaging substrate 40. The TP metal layer 11, the TP insulation layer 12, and the one or more touch layers 13 may be used to implement a touch sensor with the touch functionality. Further, a touch panel protective layer 14 may be provided on the upper surface of the touch layer 13.

Further, the first electrode 131 of the force-sensing layer 130 may be at least partially multiplexed with at least one of the touch layers 13, and/or may also be multiplexed with the touch panel metal layer 11, while at least one of the multiplexed touch layers 13 and/or the touch panel metal layer 11 are used as the first conductive layer on the first substrate.

For example, when the first electrode 131 is multiplexed with at least one of the touch layers 13, the second electrode 132 may be partially multiplexed with at least a portion of overlapped area of the reflective electrode layer 7; and/or when the first electrode 131 is multiplexed with the touch panel metal layer 11, the second electrode 132 may be partially multiplexed with at least a portion of overlapped area of the array metal layers (e.g., the gate metal layer 3).

In another embodiment, for example, the first electrode 131 may also be multiplexed with at least one of the touch layers 13, and the second electrode 132 may be multiplexed with at least a portion of overlapped area of the array metal layer; or the first electrode 131 may be multiplexed with the touch panel metal layer 11, and the second electrode 132 may be multiplexed with at least a portion of overlapped area of the reflective electrode layer 7; or the first electrode 131 may be simultaneously multiplexed with the touch layer 13 and the touch panel metal layer 11, and the second electrode 132 may be simultaneously multiplexed with the array metal layer and the reflective electrode layer 7. In this way, the area between the upper and lower electrodes of the force-sensing layer can be further increased, the mutual capacitance for force sensing can be increased, and the sensitivity of the force detection can be improved.

In certain embodiments as shown in FIG. 3, the first electrode for forming the force-sensing layer can be multiplexed with the touch layer and/or the touch panel metal layer for realizing the touch function by time division multiplexing, thereby reducing the production process of a second conductive layer such as the ITO layer 15 on the lower surface of the packaging substrate 40. The production cost can be reduced and the thickness of the organic light emitting display panel can also be reduced.

In certain embodiments shown in FIG. 3, the first electrode of the force-sensing layer is at least one layer of the touch layers for realizing the touch function, the second electrode is the reflective electrode layer and/or the array metal layer of the array substrate, and the intermediate insulation layer is the organic film of the pixel definition layer 8 and/or the optical spacers 9. When under a touch force, the organic film is pressed, the voltage of the two electrodes changes, and the magnitude of the force can be calculated. Thus, by multiplexing at least one layer of the touch layers realizing the touch function, at least one stage of the production process can be reduced, lowering the production cost, improving the production efficiency, and reducing the thickness of the finally-formed organic light emission display panel.

Figure 4:
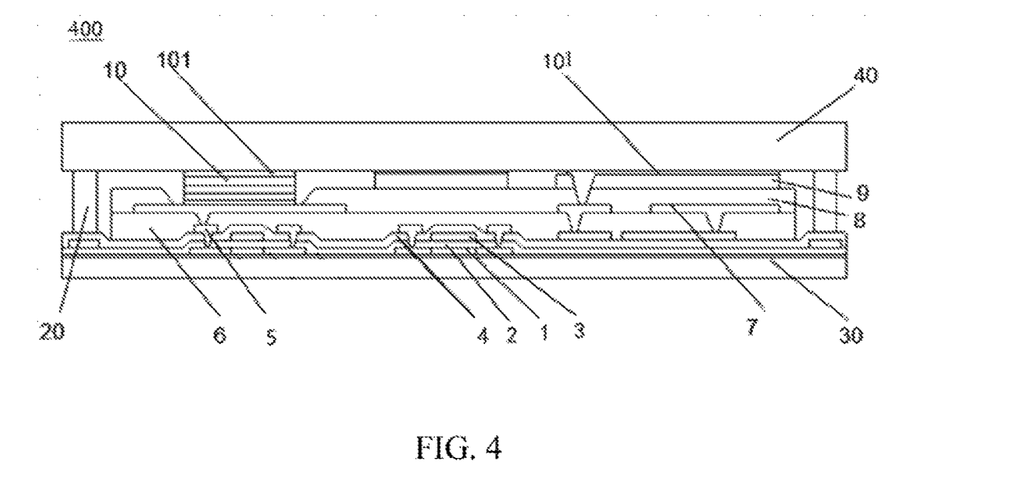
FIG. 4 illustrates a structural diagram of another exemplary organic light emitting display panel consistent with the disclosed embodiments.

FIG. 4 illustrates another exemplary organic light emitting display panel 400. As shown in FIG. 4, the array substrate of the organic light emitting display panel 400 includes an OLED cathode layer 101. The OLED cathode layer 101 may include a part of the OLED cathode layer 101 provided on the OLED light emitting unit 10, i.e., a light-emitting region of the pixel (the OLED cathode layer 101 on the left side in FIG. 4), and may also include a part of the OLED cathode layer 101 that is not provided on the OLED light emitting unit 10, i.e., a non-light-emitting region of the pixel (the OLED cathode layer 101 on the right side in FIG. 4). The OLED cathode layer 101 may be formed using a vacuum deposition process.

In certain embodiments, the part of the OLED cathode layer 101 provided on the light emitting region of each pixel can be used to realize the light emitting function of the organic light emitting display panel, and the part of the OLED cathode layer 101 provided on the non-light-emitting region of each pixel is not used to realize the light emitting function of the organic light emitting display panel, but to realize the force sensing function.

In some embodiments shown in FIG. 4, the first electrode 131 for forming the force-sensing layer 130 may be at least partially multiplexed with the OLED cathode layer 101. In one embodiment, the second electrode 132 for forming the force-sensing layer 130 may be at least partially multiplexed with the reflective electrode layer 7 of the array substrate 30. Correspondingly, the OLED cathode layer 101 for forming the first electrode 131 of the force sensor 130 overlaps with at least part of the area of the reflective electrode layer 7. Thus, in this disclosed structure, the force sensing layer is integrated in the box structure, the first electrode is the OLED cathode layer, the second electrode is the reflective electrode layer of the array substrate, and the intermediate insulation layer is the optical spacers 9 and/or the organic film of the pixel definition layer 8. When under a touch force, the organic film is pressed, the voltage of the two electrodes changes, and the magnitude of the force can be calculated.

It should be noted that, in some embodiments shown in FIG. 4, the packaging substrate 40 of the organic light emitting display panel 400 might not be integrated with a touch sensor tor realizing the touch function. In another embodiment, however, the touch sensor may be integrated in the packaging substrate 40 of the organic light emitting display panel 400.

In another embodiment, the second electrode 132 for forming the force-sensing layer 130 may be at least partially multiplexed with the array metal layer of the array substrate. The array metal layer may be any metal layer in a TFT array substrate, such as a gate metal layer 3 or a source-drain metal layer, and the second electrode 132 may be multiplexed power supply lines, reference voltage lines, or capacitor electrode layer of the array substrate. The material of the array metal layer may include one or more of molybdenum Mo, aluminum Al, silver Ag, and copper Cu, etc. Correspondingly, the OLED cathode layer 102 for forming the first electrode 131 of the force sensor 130 is at least partially overlapped with the array metal layer.

In another embodiment, the second electrode may be simultaneously multiplexed with the reflective electrode layer and the array metal layer, and the OLED cathode layer used as the first electrode is simultaneously at least partially overlapped with the reflective electrode layer and the array metal layer. Thus, the area between the upper and lower electrodes of the force-sensing layer can be further increased, and the mutual capacitance for force sensing can be increased, and the sensitivity of the force detection can be improved.

According to the disclosed organic light emitting display panel, by integrating the force sensor into the display panel, the existing display panel production process does not need to be changed, the production cost and the production process difficulty can be lowered. On the other hand, by multiplexing the second electrode of the force-sensing layer with the reflective electrode layer and/or any one of the metal layers on the second substrate, the thickness of the display and force sensing module can be reduced, thereby facilitating making the display panel lighter and thinner. At the same time, at least one stage of the production process can be reduced, the production cost can be lowered, and the production, efficiency can be improved.

In certain embodiments shown in FIGS. 2-4 above, the first electrode and the second electrode of the force-sensing layer are located on the upper and lower surfaces of the pixel definition layer, respectively, while no first electrode or second electrode is on the OLED light emitting unit. That is, in the light transmission direction, the force-sensing layer is located at the position relative to the pixel definition layer and not on the OLED light emitting unit. This arrangement has two advantages: first, the brightness of the organic light emitting display panel is not reduced by placing the force-sensing layer; second, the possible material of the first electrode and the second electrode is more extensive, and both transparent or opaque conductive material can be used to fabricate the first electrode and the second electrode.

In other embodiments, however, when the material of the first electrode is a transparent conductive material, for example, a transparent metal oxide material such as ITO, IZO, ZnO and In2O3, the first electrode may partially cover the OLED light emitting unit. Thus, the area of the first electrode can be increased, which can increase the mutual capacitance between the first electrode and the second electrode, further enhancing the force detection sensitivity of the organic light emitting display panel.

When the second electrode does not cover any of the OLED light emitting unit, the second electrode does not have any effect on the brightness of the organic light emitting display panel, and the material of the second electrode may still be a transparent or non-transparent conductive material.

In another embodiment, in the light transmission direction, both the first electrode and the second electrode are simultaneously located on the pixel definition layer and the OLED light emitting unit, i.e., the OLED light emitting unit is partially covered by the first electrode and the second electrode in the light transmission direction. In order to prevent the first electrode and the second electrode from adversely affecting the brightness of the organic light emitting display panel, the material of the first electrode and the second electrode may be a transparent conductive material and, specifically, a transparent metal oxide material, such as ITO, IZO, ZnO, or In2O3.

Thus, because both the first electrode and the second electrode are made of transparent conductive materials, both the first electrode and the second electrode can cover the OLED light emitting unit, so that the area of the first electrode and the area of the second electrode can be increased. The mutual capacitance between the first electrode and the second electrodes are also increased, and the touch sensitivity of the organic light emitting display panel can be enhanced. Further, because the first electrode and the second electrode are both transparent electrodes, the electrode patterns of the first electrode and the second electrode can be arbitrarily designed, and when the patterns of the first electrode and the second electrode are selectively adjusted, the force detection sensitivity of the organic light emitting display panel can be effectively improved.

In certain embodiments, the first electrode for forming the force-sensing layer may be multiplexed with the touch layer for realizing the touch function, the second electrode may be multiplexed with the reflective electrode layer and/or the array metal layer on the array substrate, and the first insulation layer may be multiplexed with the optical spacers and/or the pixel definition layer on the array substrate. Thus, a separate substrate is not required to be provided for the force-sensing layer, so that at least one substrate layer can be reduced, reducing the thickness of the organic light emitting display panel and making the display panel lighter and thinner. At the same time, because the force-sensing layer is directly multiplexed with existing layers of the organic light-emitting display panel, the process for bonding the force sensing layer and the organic light-emitting display panel can be omitted, simplifying the production process and shortening the production process time and cost.

Figure 5:
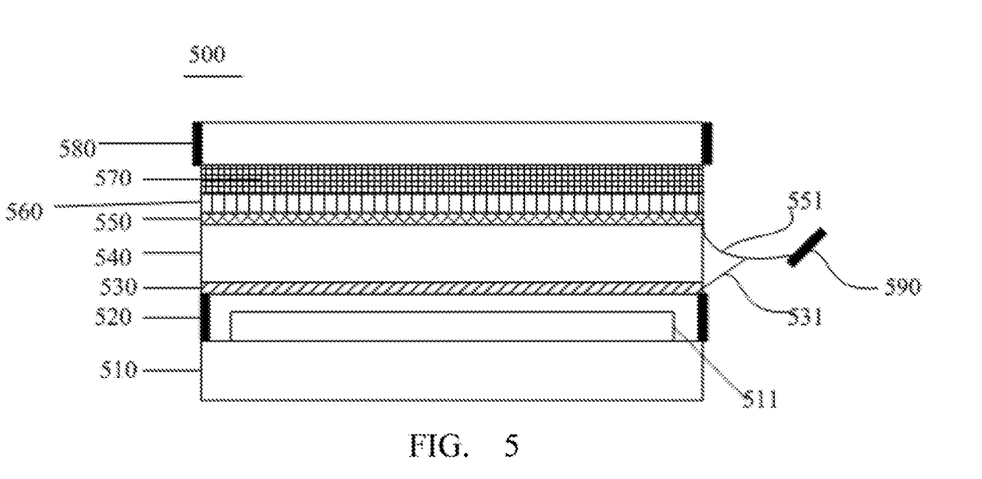
FIG. 5 illustrates a structural diagram of another exemplary organic light emitting display panel consistent with the disclosed embodiments.

FIG. 5 illustrates another exemplary organic light emitting display panel 300. As shown in FIG. 5, the organic light emitting display panel 500 includes an array substrate 510 and a packaging substrate 540. The packaging substrate 540 and the array substrate 510 may form a box-shaped structure using glass frit 520 for encapsulating the OLED light emitting unit 511, so as to prevent damage to the OLED light emitting unit 511 due to air and moisture. A force-sensing layer 530 is provided between the array substrate 510 and the packaging substrate 540, and a touch layer 550 is provided on the upper surface of the packaging substrate 540. As shown in FIG.

In certain embodiments shown in FIG. 5, the force-sensing layer 530 and the touch layer 550 may share a same drive chip (IC) 590. For example, the force-sensing layer 530 may be bonded to the drive chip 590 through a first FPC (Flexible Printed Circuit) 531, and the touch layer 550 is bound to the same drive chip 590 via a second FPC 551. The manner in which the force-sensing layer and the touch layer share the same drive chip is not limited to the embodiments shown in FIG. 5. For example, in another embodiment, the force-sensing layer may first electrically connect the signal lines to the touch layer through internal vias or wires, and the touch layer is then bound by the FPC of the touch layer to the drive chip; or the touch layer may first electrically connect its signal lines to the force-sensing layer through its internal vias or wire, and then the force-sensing layer is bound by the FPC of the force-sensing layer to the drive chip. Because the touch layer and force-sensing layer use the same drive chip, the production cost and the production process difficulty can be reduced.

In another embodiment, the force-sensing layer, the touch layer, and the organic light emitting display panel can share the same drive chip, thereby further reducing the production cost and the production process difficulty.

In another embodiment, the force-sensing layer and the organic light emitting display panel can share the same drive chip, thereby further reducing the production cost and the production process difficulty.

Further, as shown in FIG. 5, in one embodiment, a cover plate 580 (Cover lens) may also be included on the organic light emitting display panel 500 with the touch function. The area of the cover plate 580 corresponding to the OLED light emitting unit 511 is an opening area. The cover plate may be an inorganic transparent substrate, such as a glass substrate, or an organic transparent substrate, such as a PET substrate or a transparent substrate formed by polyether sulfone PES, polyacrylate PAR, polyetherimide PEI, polyethylene naphthalate PEN, or Polyethylene terephthalate PET, etc. The edge portion of the cover plate may have a black frame for shielding the wires and structures located in the non-display area of the lower surface of the cover plate.

The touch layer 550 may be attached to the inner surface of the cover plate 580 by, for example, a liquid optical clear adhesive 570 (Liquid Optical Clear Adhesive, LOCA), and the touch layer 550 is located on the box structure formed by the packaging substrate 540, the array substrate 510, and the OLED light emitting unit 511.

In another embodiment, the organic light emitting display panel 500 may also include a polarizer 560. The polarizer 560 may be disposed between the packaging substrate 540 and the cover plate 580.

Figure 6:
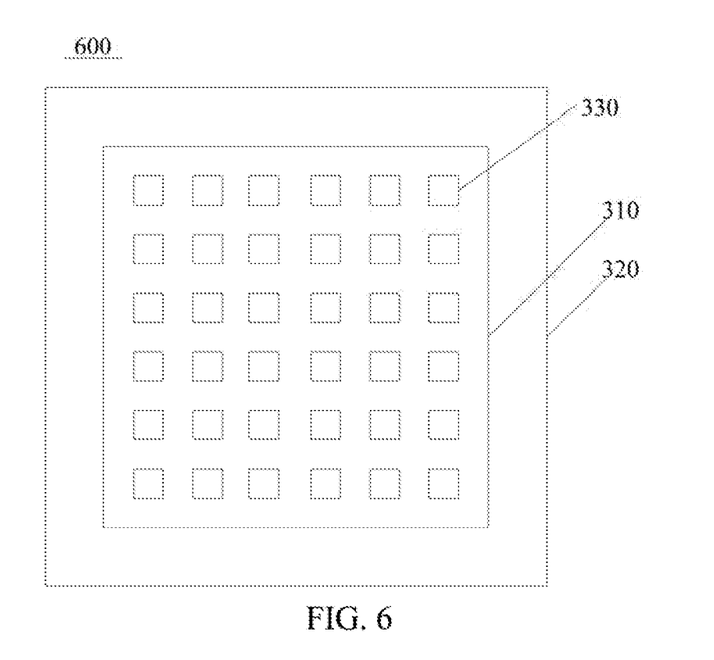
FIG. 6 illustrates a structural diagram of another exemplary organic light emitting display panel consistent with the disclosed embodiments.

FIG. 6 illustrates another exemplary organic light emitting display panel 600. As shown in FIG. 6, the organic light emitting display panel 600 may include a display area 310 and a non-display area 320 surrounding the display area 310. Further, the force-sensing layer is located in the display area (including the portion of the pixel matrix) for forming the force sensors 330 of the force-sensing layer, which may be arranged in a matrix and provided in the display area 310. In one embodiment, the force sensors 330 may be evenly or uniformly distributed within the display area 310.

Figure 7:
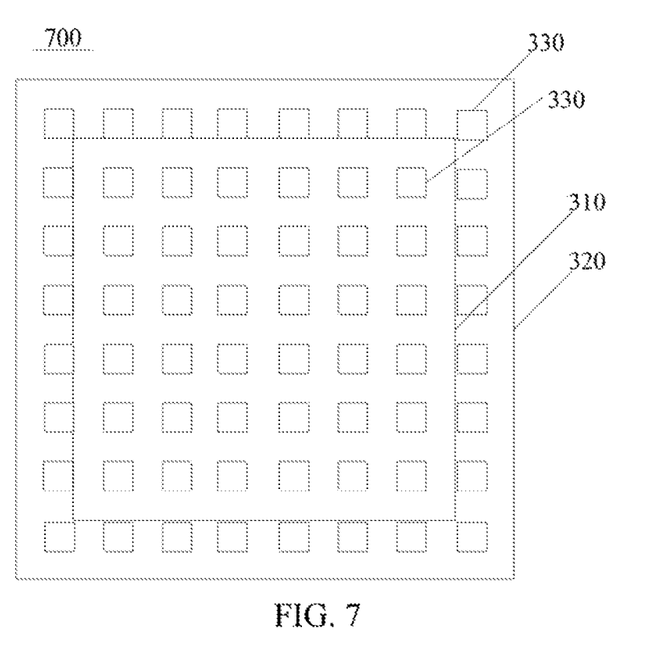
FIG. 7 illustrates a structural diagram of another exemplary organic light emitting display panel consistent with the disclosed embodiments.

FIG. 7 illustrates another exemplary organic light emitting display panel 700. As show in FIG. 7, the organic light emitting display panel 700 may include a display area 310 and a non-display area 320 surrounding the display area 310.

Different from those shown in FIG. 6, the force sensors 330 for forming the force-sensing layer may be provided not only in the display region 310 but also in the non-display region 320. That is, a circle of force-sensing layer pattern may be added in the periphery of the display panel, further improving the sensitivity of the force sensors and expanding the area of the panel with the force sensing function.

In another embodiment, the force sensors 330 for forming the force-sensing layer may also be provided in the non-display region 320 only. In one embodiment, the second electrode for forming the force-sensing layer may be a plate electrode. In another embodiment, the second electrode for forming the force-sensing layer may also be divided into a plurality of blocks distributed on the organic light emitting display panel.

Figure 8:
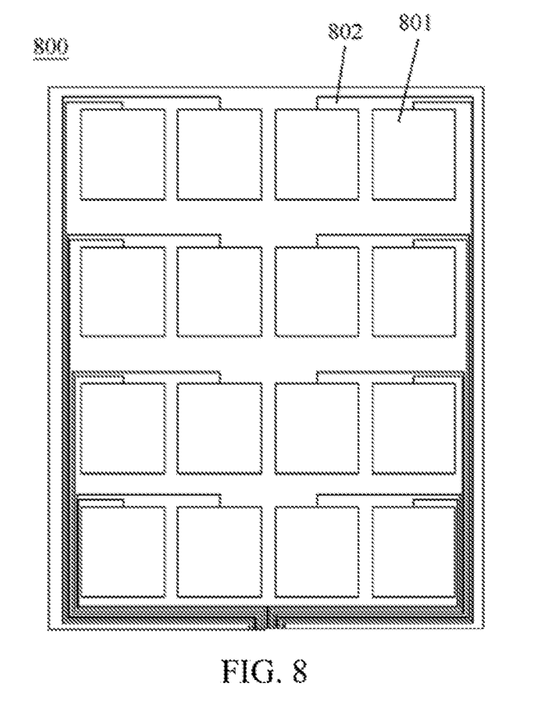
FIG. 8 illustrates a structural diagram of another exemplary organic light emitting display panel consistent with the disclosed embodiments.

FIG. 8 illustrates another exemplary organic light emitting display panel 800. As shown in FIG. 8, in the organic light emitting display panel 800, the second electrode for forming the force-sensing layer may be divided into a plurality, of blocks 801 on the organic light emitting display panel 800. For example, the plurality of blocks 801 may be arranged in a matrix of 4×4. Of course, other matrix designs may also be used, such as 5×5, 6×6, or 4×9, etc. By using the plurality of blocks 801, each block 801 may form a force sensing channel, and each block is connected to the drive chip through a signal line 802. When a change in the capacitance of a block is detected, the coordinate position of the force sensor can be quickly determined. When the number of blocks divided on the organic light emitting display panel of the same area is increased, the positioning accuracy of the force sensing is also increased.

In certain embodiments, the blocks 801 may be a mesh structure formed by electrically connecting the second electrode in the non-light emitting region of each pixel in the pixel matrix of the organic light emitting display panel 800. For example, the reflective electrode layers in the non-light emitting regions of the respective pixels may be electrically connected to each other to form a mesh structure. Other structures may also be used.

It should be noted that, although the blocks shown in FIG. 8 are in a rectangular shape, the present disclosure is not limited thereto, and each block may be in any appropriate shape, such as a diamond shape.

Figure 9:
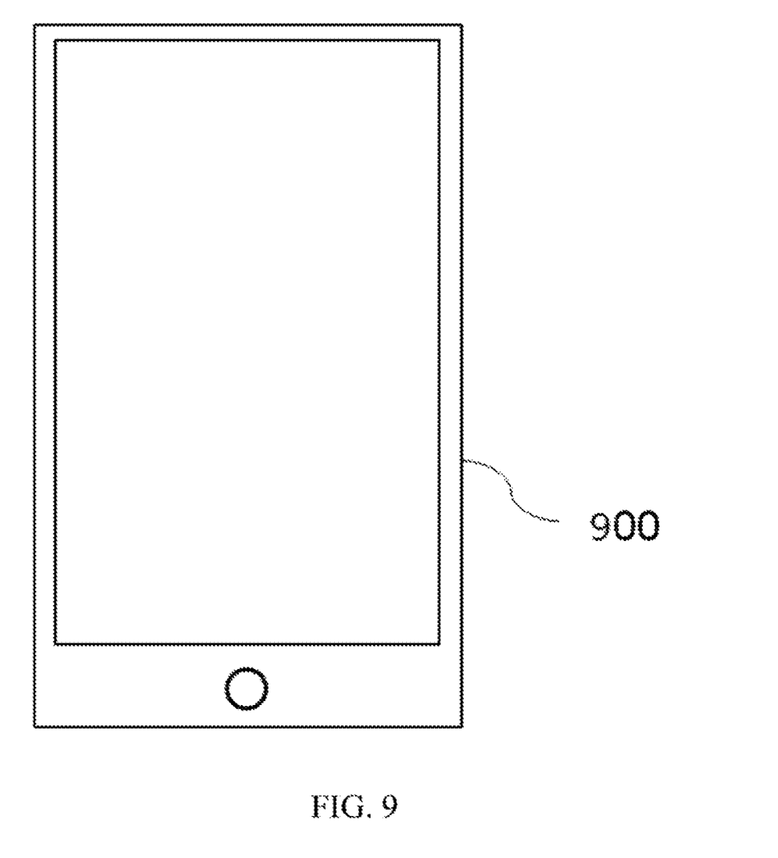
FIG. 9 illustrates a structural diagram of an exemplary force sensing display device consistent with the disclosed embodiments.

FIG. 9 illustrates an exemplars force sensing display device 900. As shown in FIG. 9, the force-sensing display device 900 includes an organic light emitting display panel. The organic light emitting display panel includes a first substrate, a second substrate disposed opposite to the first substrate, and a force-sensing layer.

The force sensing display device 900 may include a variety of terminals, such as a smartphone, a tablet computer, a personal digital assistant (PDA), or the like, and the present disclosure is not limited thereto.

The force-sensing layer may include a first electrode, a second electrode, and a first insulation layer between the first electrode and the second electrode. The second electrode is multiplexed with at least one conductive layer on the second substrate.

In one embodiment, the organic light emitting display panel of the force sensing display device 900 may further include a touch layer.

In another embodiment, the first electrode may be multiplexed with at least one layer of the touch layer, and the second electrode may be multiplexed at least partially with the reflective electrode layer of the second substrate.

In one embodiment, the force-sensing layer and the touch layer may share a same drive chip. In another embodiment, the organic light emitting display panel, the force-sensing layer, and the touch layer may share the same drive chip, further reducing the cost, making the product design easier, and simplifying the manufacturing process. More details about the force sensing display device may refer to previously described embodiments.

According to the disclosed organic light emitting display panels and force sensing display devices, by integrating the force sensors into the display panel, it is not necessary to change the existing panel production process, thereby reducing the production cost and the production process difficulty. In addition, by multiplexing the force sensing electrode and the existing conductive film layer(s) of the display panel, the number of stages of the production process can be reduced, the production cost can be lowered, and the production efficiency can be improved.

After taking into consideration the specification and practicing the disclosure disclosed herein, those skilled in the relevant art may easily obtain other embodiments of the present disclosure. The present disclosure is intended to cover any variation, usage, or adaptable change of the present disclosure. These variations, usages, or adaptable changes may obey general principles of the present disclosure and include common knowledge or common technical solutions not disclosed by the present disclosure in the relevant technical field. The specification and the embodiments are merely exemplary, and the true scope and spirit of the present disclosure are defined by the appended claims.

What is claimed is:

1. An organic light emitting display panel, comprising:
  a first substrate;
  a second substrate disposed opposing the first substrate, wherein a reflective electrode layer, an array metal layer and an organic light emitting unit are disposed on a surface of the second substrate facing the first substrate, and the organic light emitting unit is disposed on a surface of the reflective electrode layer away from the second substrate; and
  an integrated force sensing layer, comprising:
  a first electrode;
  a second electrode; and
  a first insulating layer positioned between the first electrode and the second electrode,
  wherein
    the reflective electrode layer includes a first portion overlapping with the organic light emitting unit and a separate second portion non-overlapping with the organic light emitting unit, along a direction perpendicular to the first substrate, the first portion of the reflective electrode layer and the second portion of the reflective electrode layer are disconnected and are in a same layer and contain a same material, and the second portion, but not the first portion, of the reflective electrode layer is used as the second electrode, or
    the array metal layer includes a first portion overlapping with the organic light emitting unit and a separate second portion non-overlapping with the organic light emitting unit, along the direction perpendicular to the first substrate, the first portion of the array metal layer and the second portion of the array metal layer are disconnected and are in a same layer and contain a same material, and the second portion, but not the first portion, of the array metal layer is used as the second electrode, and a capacitance change between the first electrode and the second electrode detects a magnitude of force when the organic light emitting display panel is pressed.

2. The organic light emitting display panel according to claim 1, wherein:
the first substrate is a packaging substrate,
the second substrate is an array substrate, and
the array substrate further includes a pixel definition layer and a plurality of optical spacers.

3. The organic light emitting display panel according to claim 2, wherein the second portion of the reflective electrode layer used as the second electrode is non-overlapping with the first portion of the reflective electrode layer.

4. The organic light emitting display panel of claim 2, wherein the second portion of the array metal layer used as the second electrode is non-overlapping with the first portion of the array metal layer.

5. The organic light emitting display panel according to claim 2, wherein the array substrate further comprises an OLED cathode layer, and at least one portion of the OLED cathode layer is used as the first electrode.

6. The organic light emitting display panel according to claim 1, wherein the first electrode is a first conductive layer provided on the first substrate.

7. The organic light emitting display panel according to claim 6, further comprising:
a touch sensor provided on the first substrate, wherein the touch sensor includes at least one touch layer.

8. The organic light emitting display panel according to claim 7, wherein the at least one touch layer of the touch sensor is used as the first electrode; or the touch sensor is disposed on a side of the first substrate away from the second substrate, and the first electrode is disposed on a side of the first substrate close to the second substrate.

9. The organic light emitting display panel according to claim 2, wherein the first insulating layer includes the pixel defining layer or the plurality of optical spacers.

10. The organic light emitting display panel according to claim 7, wherein the force sensing layer and the at least one touch layer share a same driving chip.

11. The organic light emitting display panel according to claim 1, wherein:
the organic light emitting display panel includes a display area and a non-display area surrounding the display area, and
the force sensing layer is provided in the non-display area.

12. The organic light emitting display panel according to claim 1, wherein the second electrode is divided into a plurality of blocks on the organic light emitting display panel.

13. A force sensing display device, comprising:
an organic light emitting display panel, including:
a first substrate;
a second substrate disposed opposing the first substrate, wherein a reflective electrode layer, an array metal layer and an organic light emitting unit are disposed on a surface of the second substrate facing the first substrate, and the organic light emitting unit is disposed on a surface of the reflective electrode layer away from the second substrate; and
an integrated force sensing layer, comprising:
a first electrode;
a second electrode; and
a first insulating layer positioned between the first electrode and the second electrode,
wherein
the reflective electrode layer includes a first portion overlapping with the organic light emitting unit and a separate second portion non-overlapping with the organic light emitting unit, along a direction perpendicular to the first substrate, the first portion of the reflective electrode layer and the second portion of the reflective electrode layer are disconnected and are in a same layer and contain a same material, and the second portion, but not the first portion, of the reflective electrode layer is used as the second electrode, or
the array metal layer includes a first portion overlapping with the organic light emitting unit and a separate second portion non-overlapping with the organic light emitting unit, along the direction perpendicular to the first substrate, the first portion of the array metal layer and the second portion of the array metal layer are disconnected and are in a same layer and contain a same material, and the second portion, but not the first portion, of the array metal layer is used as the second electrode, and
a capacitance change between the first electrode and the second electrode detects a magnitude of force when the organic light emitting display panel is pressed.

14. The force sensing display device according to claim 13, wherein:
the organic light emitting display panel further comprises a touch layer, and
the force sensing layer and the touch layer share a same drive chip.

15. The force sensing display device according to claim 14, wherein the organic light emitting display panel, the force sensing layer, and the touch layer share the same drive chip.

16. The force sensing display device of claim 13, wherein:
the organic light emitting display panel further comprises a touch layer,
the touch layer is used as the first electrode, and
at least one portion of the reflective electrode layer of the second substrate is used as the second electrode.

17. The organic light emitting display panel according to claim 2,
wherein the first insulating layer includes the pixel defining layer and the plurality of optical spacers.

18. The organic light emitting display panel according to claim 5, wherein:
the at least one portion of the OLED cathode layer used as the first electrode is overlapped with, along the direction perpendicular to the first substrate, second portion of the reflective electrode layer or the second portion of the array metal layer used as the second electrode.

19. The organic light emitting display panel according to claim 6, wherein:
the first conductive layer is overlapped with, along the direction perpendicular to the first substrate, the second portion of the reflective electrode layer or the second portion of the array metal layer used as the second electrode.

20. The force sensing display device of claim 16, wherein:
the touch layer used as the first electrode is overlapped with the at least one portion of the reflective electrode layer used as the second electrode, along the direction perpendicular to the first substrate.

* * * * *